US012593492B2

(12) United States Patent
Wang et al.

(10) Patent No.: US 12,593,492 B2
(45) Date of Patent: Mar. 31, 2026

(54) ELECTRONIC DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Jer-Fu Wang, Taipei City (TW); Chao-Ching Cheng, Hsinchu City (TW); Hung-Li Chiang, Taipei City (TW); Iuliana Radu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 519 days.

(21) Appl. No.: 18/154,863

(22) Filed: Jan. 16, 2023

(65) Prior Publication Data

US 2024/0113197 A1      Apr. 4, 2024

Related U.S. Application Data

(60) Provisional application No. 63/377,547, filed on Sep. 29, 2022.

(51) Int. Cl.
| | |
|---|---|
| *H10D 64/66* | (2025.01) |
| *H10D 30/43* | (2025.01) |
| *H10D 30/62* | (2025.01) |
| *H10D 30/67* | (2025.01) |
| *H10D 62/10* | (2025.01) |
| *H10D 64/01* | (2025.01) |

(52) U.S. Cl.
CPC ....... *H10D 64/667* (2025.01); *H10D 30/6739* (2025.01); *H10D 64/01* (2025.01); *H10D 30/43* (2025.01); *H10D 30/62* (2025.01); *H10D 30/6735* (2025.01); *H10D 62/121* (2025.01)

(58) Field of Classification Search
CPC .. H10D 64/667; H10D 30/6739; H10D 64/01; H10D 30/43; H10D 30/62; H10D 30/6735; H10D 62/121; H10D 30/6757; H10D 30/014
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,796,666 | B1 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,836,016 | B2 | 9/2014 | Wu et al. |
| 8,841,701 | B2 | 9/2014 | Lin et al. |
| 8,847,293 | B2 | 9/2014 | Lee et al. |

(Continued)

*Primary Examiner* — Mohammad A Rahman
(74) *Attorney, Agent, or Firm* — WPAT LAW; Anthony King

(57) ABSTRACT

An electronic device and a method for manufacturing the same are provided. The electronic device includes a substrate and a gate structure. The substrate includes a fin. The fin includes a source region and a drain region spaced apart from the source region. The gate structure is located between the source region and the drain region. The gate structure includes a work function layer. The work function layer includes a compound of a metal material and a Group VIA material.

20 Claims, 11 Drawing Sheets

(56)                References Cited

U.S. PATENT DOCUMENTS

| 8,853,025 | B2 | 10/2014 | Zhang et al. | |
|---|---|---|---|---|
| 8,860,148 | B2 | 10/2014 | Hu et al. | |
| 8,962,400 | B2 | 2/2015 | Tsai et al. | |
| 8,963,258 | B2 | 2/2015 | Yu et al. | |
| 9,093,514 | B2 | 7/2015 | Tsai et al. | |
| 9,093,530 | B2 | 7/2015 | Huang et al. | |
| 9,105,490 | B2 | 8/2015 | Wang et al. | |
| 9,171,929 | B2 | 10/2015 | Lee et al. | |
| 9,209,247 | B2 | 12/2015 | Colinge et al. | |
| 9,214,555 | B2 | 12/2015 | Oxland et al. | |
| 9,236,267 | B2 | 1/2016 | De et al. | |
| 9,236,300 | B2 | 1/2016 | Liaw | |
| 9,245,805 | B2 | 1/2016 | Yeh et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,548,303 | B2 | 1/2017 | Lee et al. | |
| 9,576,814 | B2 | 2/2017 | Wu et al. | |
| 9,608,116 | B2 | 3/2017 | Ching et al. | |
| 2006/0275968 | A1* | 12/2006 | Mantl | H01L 21/28518 257/E21.163 |
| 2022/0293736 | A1* | 9/2022 | Khaderbad | H10D 30/751 |
| 2022/0320089 | A1* | 10/2022 | Chu | H10D 84/0181 |

* cited by examiner

90

S91 Providing a semiconductor structure including a substrate, a spacer, a trench and at least one gate dielectric layer S92 Forming a metal material layer in the trench and on the at least one gate dielectric layer S93 Vulcanizing the metal material layer to form a work function layer by a vulcanizing agent

ELECTRONIC DEVICE AND METHOD FOR MANUFACTURING THE SAME

PRIORITY CLAIM AND CROSS-REFERENCE

This application claims the benefit of prior-filed provisional application No. 63/377,547, filed on Sep. 29, 2022.

BACKGROUND

As for electronic devices such as field-effect transistors (FET), a work function metal (WFM) is used to fill a channel (or a gap) of a gate structure of the FET. In the manufacture of the FET, metal nitride is often used to fill the channel of the gate structure as the WFM. The channel is known to be tiny. Therefore, an opening of the channel is closed before the metal nitride fully fills the channel. After the WFM is formed, voids will be generated, causing the FET failure (e.g., threshold voltage variation or circuit failure).

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
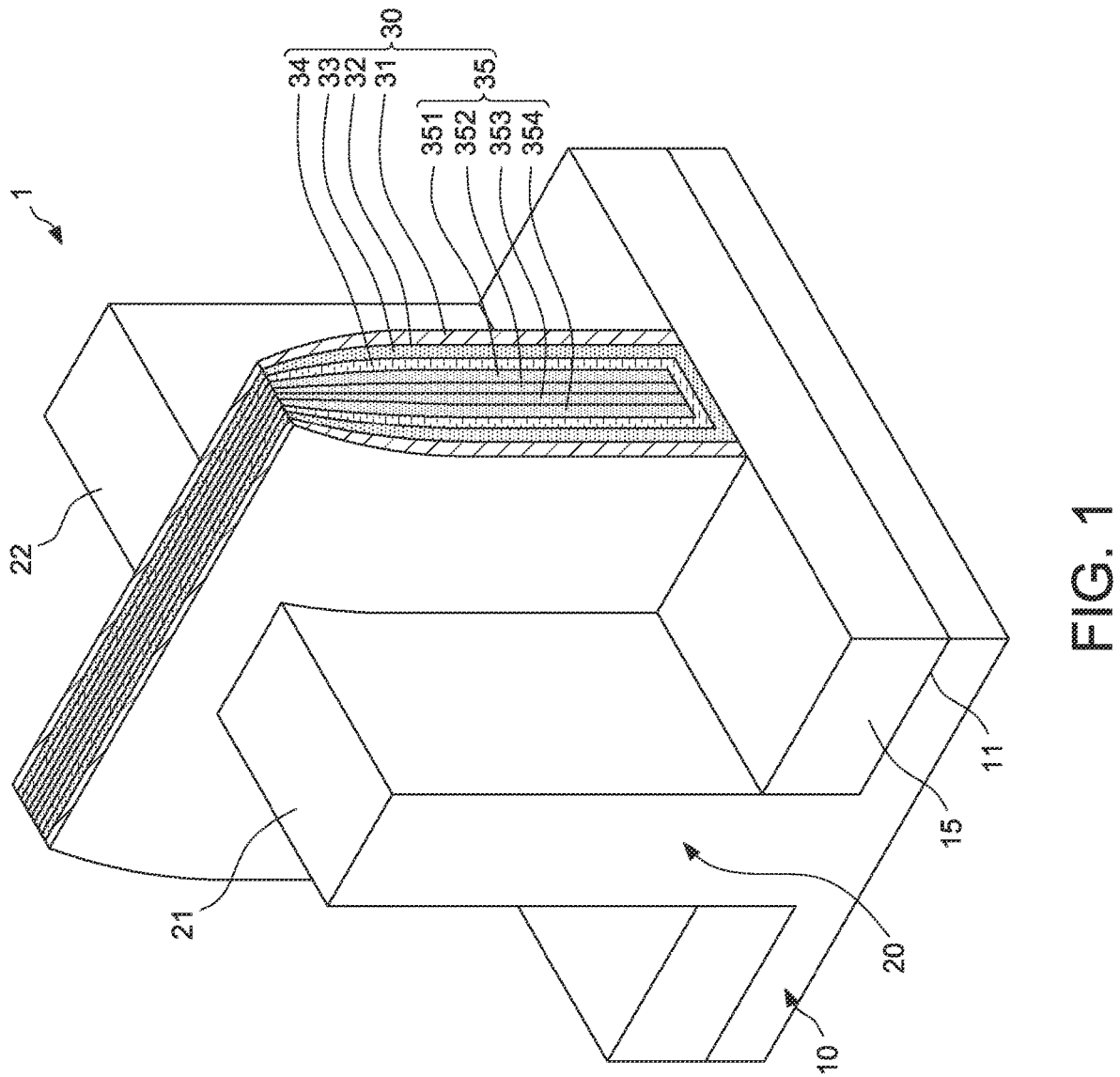
FIG. 1 illustrates a perspective view of an electronic device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 2:
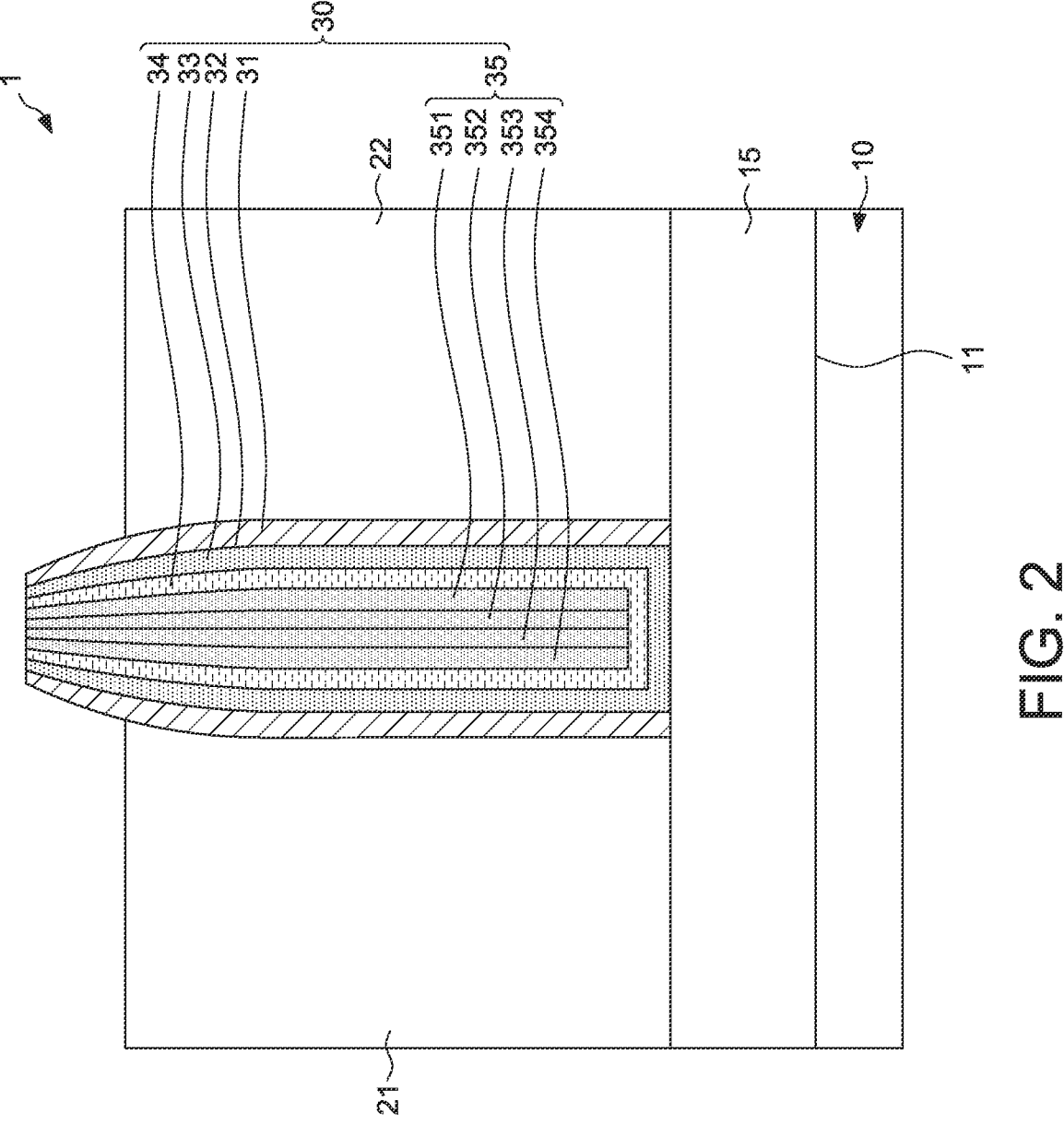
FIG. 2 illustrates a side view of FIG. 1.

FIG. 1 illustrates a perspective view of an electronic device 1 according to some embodiments of the present disclosure. FIG. 2 illustrates a side view of FIG. 1. The electronic device 1 includes a substrate 10 and a gate structure 30. In some embodiments, the electronic device 1 can be a fin field-effect transistor (FinFET). The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The substrate 10 can be, for example, silicon substrate. In some embodiments, as shown in FIG. 1 and FIG. 2, the substrate 10 can have a top surface 11 and include a fin 20 and a shallow trench isolation (STI) 15. In some embodiments, the fin 20 can be, for example, silicon germanium fin. The fin 20 can protrude from the top surface 11. In some embodiments, the fin 20 can include a source region 21 and a drain region 22 opposite to the source region 21. The drain region 22 can be spaced apart from the source region 21. The shallow trench isolation 15 can be disposed on the top surface 11 and at two sides of the fin 20. In some embodiments, the source region 21 and the drain region 22 can be separated by the shallow trench isolation 15. In some embodiments, a material of the shallow trench isolation 15 can be, for example, silicon dioxide ($SiO_2$).

The gate structure 30 is disposed on the shallow trench isolation 15 and located between the source region 21 and the drain region 22 of the fin 20. In some embodiments, as shown in FIG. 1 and FIG. 2, the gate structure 30 can include a spacer 31, a trench 32, at least one gate dielectric layer (including, for example, a first gate dielectric layer 33 and a second gate dielectric layer 34) and a work function layer 35. The spacer 31 can be disposed between the source region 21 and the drain region 22 of the fin 20. In some embodiments, the spacer 31 can be, for example, nitride spacer. The trench 32 can extend through the spacer 31. In some embodiments, the trench 32 can also be referred to as "fin to fin spacing." The at least one gate dielectric layer (e.g., the first gate dielectric layer 33 and the second gate dielectric layer 34) can be located in the trench 32 and contacts the spacer 31. In some embodiments, the at least one gate dielectric layer (e.g., the first gate dielectric layer 33) can fully cover an inner wall of the trench 32. A material of the at least one gate dielectric layer (e.g., the first gate dielectric layer 33 and the second gate dielectric layer 34) can be, for example, a high-dielectric constant (high-x) material.

The work function layer 35 is located in the trench 32 and on the at least one gate dielectric layer (e.g., the second gate dielectric layer 34). As shown in FIG. 1 and FIG. 2, the work function layer 35 fully fills the trench 32. The work function layer 35 can be spaced apart from the spacer 31 through the at least one gate dielectric layer (e.g., the first gate dielectric layer 33 and the second gate dielectric layer 34). In some embodiments, the second gate dielectric layer 34 can be omitted to increase a thickness of the work function layer 35. That is, the thickness of the work function layer 35 can be adjusted by changing the layer number of the gate dielectric layer. In some embodiments, the work function layer 35 can include a compound of a metal material and a Group VIA material. Alternatively, the work function layer 35 can include a metal material modified by a Group VIA material. In some embodiments, the metal material can include platinum (Pt), tantalum (Ta) or titanium (Ti). The Group VIA material can include sulfur (S) or selenium (Se). For example, the work function layer 35 can include a metal sulfide. Therefore, the compound can include $Pt_xS_y$, $Pt_xSe_y$, $Ta_xS_y$, $Ta_xSe_y$, $Ti_xS_y$, or $Ti_xSe_y$. In some embodiments, x can be a multiple of 1, and y can be equal to 2x. That is, the compound can be, for example, $PtS_2$, $Pt_2S_4$, $PtSe_2$, $Pt_2Se_4$, $TaS_2$, $Ta_2S_4$, $TaSe_2$, $Ta_2Se_4$, $TiS_2$, $Ti_2S_4$, $TiSe_2$, $Ti_2Se_4$, and so on. In some embodiments, the metal material can further include vanadium (V), chromium (Cr), manganese (Mn), cobalt (Co), nickel (Ni), zinc (Zn), rubidium (Rb), strontium (Sr), yttrium (Y), zirconium (Zr), niobium (Nb), molybdenum (Mo), palladium (Pd), cadmium (Cd), indium (In), tin (Sn), antimony (Sb), cesium (Cs), barium (Ba), lanthanum (La), hafnium (Hf), or tungsten (W).

In some embodiments, the work function layer 35 can be a multilayer structure (including, for example, a first compound layer 351, a second compound layer 352, a third compound layer 353 and a fourth compound layer 354). In some embodiments, a number of layers (e.g., the first compound layer 351, the second compound layer 352, the third compound layer 353 and the fourth compound layer 354) of the multilayer structure can be even. In some embodiments, each of the layers (e.g., the first compound layer 351, the second compound layer 352, the third compound layer 353 and the fourth compound layer 354) of the multilayer structure can have a same thickness (e.g., a maximum thickness). The thickness of each of the layers (e.g., the first compound layer 351, the second compound layer 352, the third compound layer 353 and the fourth compound layer 354) may be measured along a direction substantially parallel with the top surface 11 of the substrate 10. A thickness of each of the layers (e.g., the first compound layer 351, the second compound layer 352, the third compound layer 353 and the fourth compound layer 354) of the multilayer structure can be 2 Å to 5 Å. In some embodiments, the thickness of the work function layer 35 (including, for example, the first compound layer 351, the second compound layer 352, the third compound layer 353 and the fourth compound layer 354) can be 4 Å to 60 Å, or 10 Å to 30 Å. Thus, the material of the work function layer 35 (including, for example, the first compound layer 351, the second compound layer 352, the third compound layer 353 and the fourth compound layer 354) can be referred to as a 2D material. The minimum number of the layers of the multilayer structure can be two. In some embodiments, the thickness of the work function layer 35 (including, for example, the first compound layer 351, the second compound layer 352, the third compound layer 353 and the fourth compound layer 354) can be, 6 Å to 50 Å, 8 Å to 40 Å, or 10 Å to 30 Å.

As shown in the embodiment illustrated in FIG. 1 and FIG. 2, the metal material and the Group VIA material can be used to form ultra-thin (e.g., 2A to 5A) compound layers (including, for example, the first compound layer 351, the second compound layer 352, the third compound layer 353 and the fourth compound layer 354) to constitute the work function layer 35. Through the ultra-thin compound layers (e.g., the first compound layer 351, the second compound layer 352, the third compound layer 353 and the fourth compound layer 354), the work function layer 35 can fully fill the trench 32 (i.e., the fin to fin spacing) before an opening of the trench 32 is closed. Thus, no voids will be generated in the work function layer 35 to prevent threshold voltage variation or circuit failure of the electronic device 1.

Figure 3:
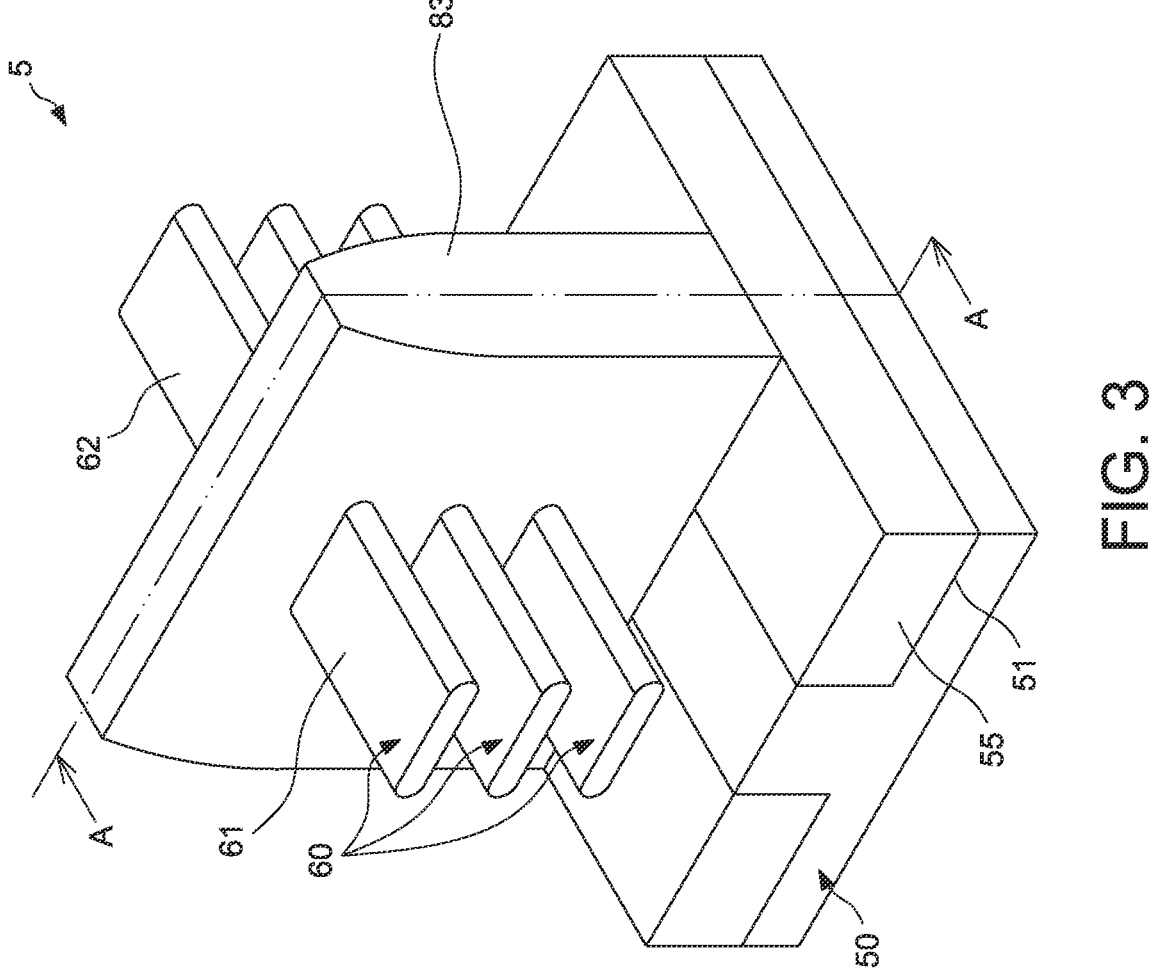
FIG. 3 illustrates a perspective view of an electronic device according to some embodiments of the present disclosure.
Figure 4:
FIG. 4 illustrates a cross-sectional view along line A-A of FIG. 3.
Figure 4:
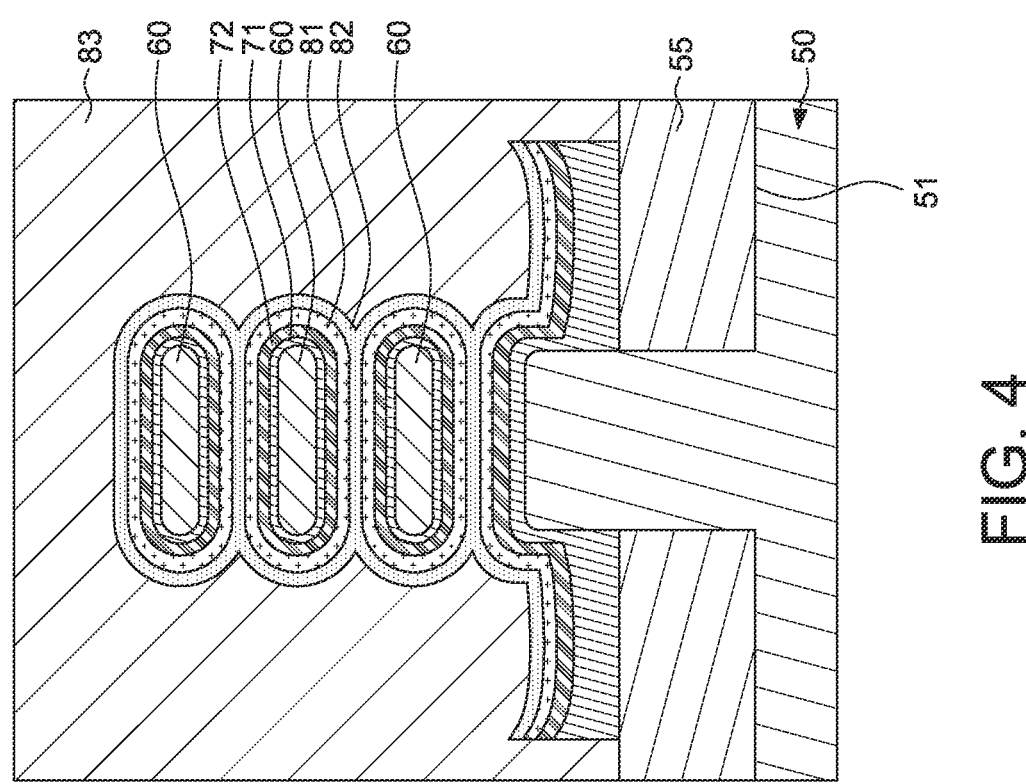

FIG. 3 illustrates a perspective view of an electronic device 5 according to some embodiments of the present disclosure. FIG. 4 illustrates a cross-sectional view along line A-A of FIG. 3. The electronic device 5 includes a substrate 50, a plurality of semiconductor nano-sheet channels 60, an interfacial layer 71, a gate dielectric layer 72, a first gate layer 81, a second gate layer 82 and a gate electrode 83. In some embodiments, the electronic device 5 can be a gate-all-around nano-sheet field-effect transistor (GAA-NS-FET). The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The substrate 50 can be, for example, silicon substrate. In some embodiments, as shown in FIG. 3 and FIG. 4, the substrate 50 can have a top surface 51 and include a shallow trench isolation (STI) 55. The shallow trench isolation 55 can be disposed on the top surface 51. In some embodiments, a material of the shallow trench isolation 55 can be, for example, silicon dioxide ($SiO_2$).

The plurality of semiconductor nano-sheet channels 60 are located over the substrate 50 and longitudinally spaced apart from each other. In some embodiments, as shown in FIG. 3, each of the plurality of semiconductor nano-sheet channels 60 can include a source region 61 and a drain region 62 oppositely arranged at its two ends. In some embodiments, the plurality of semiconductor nano-sheet channels 60 can be, for example, silicon germanium nano-sheet channels. In some embodiments, a spacing between the plurality of semiconductor nano-sheet channels 60 can also be referred to as "channel to channel spacing."

In some embodiments, as shown in FIG. 4, the interfacial layer 71 can surround the plurality of semiconductor nano-sheet channels 60. In some embodiments, a material of the interfacial layer 71 can be, for example, silicon dioxide ($SiO_2$).

The gate dielectric layer 72 can surround the interfacial layer 71 and the plurality of semiconductor nano-sheet channels 60. In some embodiments, as shown in FIG. 4, the interfacial layer 71 can be between the gate dielectric layer 72 and each of the plurality of semiconductor nano-sheet channels 60. A material of the gate dielectric layer 72 can be, for example, a high-dielectric constant (high-x) material.

The first gate layer 81 can surround the gate dielectric layer 72. The first gate layer 81 can be a work function layer. In some embodiments, the first gate layer 81 can include a compound of a first metal material and a Group VIA material. In some embodiments, the first metal material can include platinum (Pt), tantalum (Ta) or titanium (Ti). The Group VIA material can include sulfur (S) or selenium (Se). Therefore, the compound can include $Pt_xS_y$, $Pt_xSe_y$, $Ta_xS_y$, $Ta_xSe_y$, $Ti_xS_y$, or $Ti_xSe_y$. In some embodiments, x can be a multiple of 1, and y can be equal to 2x. That is, the compound can be, for example, $PtS_2$, $Pt_2S_4$, $PtSe_2$, $Pt_2Se_4$, $TaS_2$, $Ta_2S_4$, $TaSe_2$, $Ta_2Se_4$, $TiS_2$, $Ti_2S_4$, $TiSe_2$, $Ti_2Se_4$, and so on. In some embodiments, the first metal material can further include vanadium (V), chromium (Cr), manganese (Mn), cobalt (Co), nickel (Ni), zinc (Zn), rubidium (Rb), strontium (Sr), yttrium (Y), zirconium (Zr), niobium (Nb), molybdenum (Mo), palladium (Pd), cadmium (Cd), indium (In), tin (Sn), antimony (Sb), cesium (Cs), barium (Ba), lanthanum (La), hafnium (Hf), or tungsten (W).

In some embodiments, the first gate layer 81 can be a multilayer structure. In some embodiments, a number of layers of the multilayer structure can be even. In some embodiments, each of the layers of the multilayer structure can have a same thickness (e.g., a maximum thickness). A thickness of each of the layers of the multilayer structure can be 2 Å to 5 Å. In some embodiments, a thickness of the first gate layer 81 can be 4 Å to 60 Å. The minimum number of the layers of the multilayer structure can be 2. In some embodiments, the thickness of the first gate layer 81 can be 6 Å to 50 Å, 8 Å to 40 Å, or 10 Å to 30 Å.

The second gate layer 82 can surround the first gate layer 81. The second gate layer 82 can be a work function layer. In some embodiments, the second gate layer 82 can include a compound of a second metal material and the Group VIA material. In some embodiments, the compound of the second gate layer 82 can be different from the compound of the first gate layer 81. In some embodiments, the second metal material can include platinum (Pt), tantalum (Ta) or titanium (Ti). The Group VIA material can include sulfur (S) or selenium (Se). Therefore, the compound can include $Pt_xS_y$, $Pt_xSe_y$, $Ta_xS_y$, $Ta_xSe_y$, $Ti_xS_y$, or $Ti_xSe_y$. In some embodiments, x can be a multiple of 1, and y can be equal to 2x. That is, the compound can be, for example, $PtS_2$, $Pt_2S_4$, $PtSe_2$, $Pt_2Se_4$, $TaS_2$, $Ta_2S_4$, $TaSe_2$, $Ta_2Se_4$, $TiS_2$, $Ti_2S_4$, $TiSe_2$, $Ti_2Se_4$, and so on. In some embodiments, the second metal material can further include vanadium (V), chromium (Cr), manganese (Mn), cobalt (Co), nickel (Ni), zinc (Zn), rubidium (Rb), strontium (Sr), yttrium (Y), zirconium (Zr), niobium (Nb), molybdenum (Mo), palladium (Pd), cadmium (Cd), indium (In), tin (Sn), antimony (Sb), cesium (Cs), barium (Ba), lanthanum (La), hafnium (Hf), or tungsten (W).

In some embodiments, the second gate layer 82 can be a multilayer structure. In some embodiments, a number of layers of the multilayer structure can be even. In some embodiments, each of the layers of the multilayer structure can have a same thickness (e.g., a maximum thickness). A thickness of each of the layers of the multilayer structure can be 2 Å to 5 Å. In some embodiments, a thickness of the second gate layer 82 can be 4 Å to 60 Å. The minimum number of the layers of the multilayer structure can be two. In some embodiments, the thickness of the second gate layer 82 can be 6 Å to 50 Å, 8 Å to 40 Å, or 10 Å to 30 Å.

The gate electrode 83 can cover or contact the second gate layer 82. In some embodiments, the gate electrode 83 can include a metal material.

As shown in the embodiment illustrated in FIG. 4, the metal material and the Group VIA material can be used to form ultra-thin (e.g., 2A to 5A) compound layers to constitute the first gate layer 81 and the second gate layer 82. Through the ultra-thin compound layers, the first gate layer 81 and the second gate layer 82 can fully fill the spacing between the plurality of semiconductor nano-sheet channels 60 (i.e., the channel to channel spacing). Thus, no voids will be generated in the first gate layer 81 and the second gate layer 82 to prevent threshold voltage variation or circuit failure of the electronic device 5.

FIG. 5 through FIG. 10 illustrate a method for manufacturing an electronic device according to some embodiments of the present disclosure. In some embodiments, the method is for manufacturing an electronic device such as the electronic device 1 shown in FIG. 1 and FIG. 2.

Figure 5:
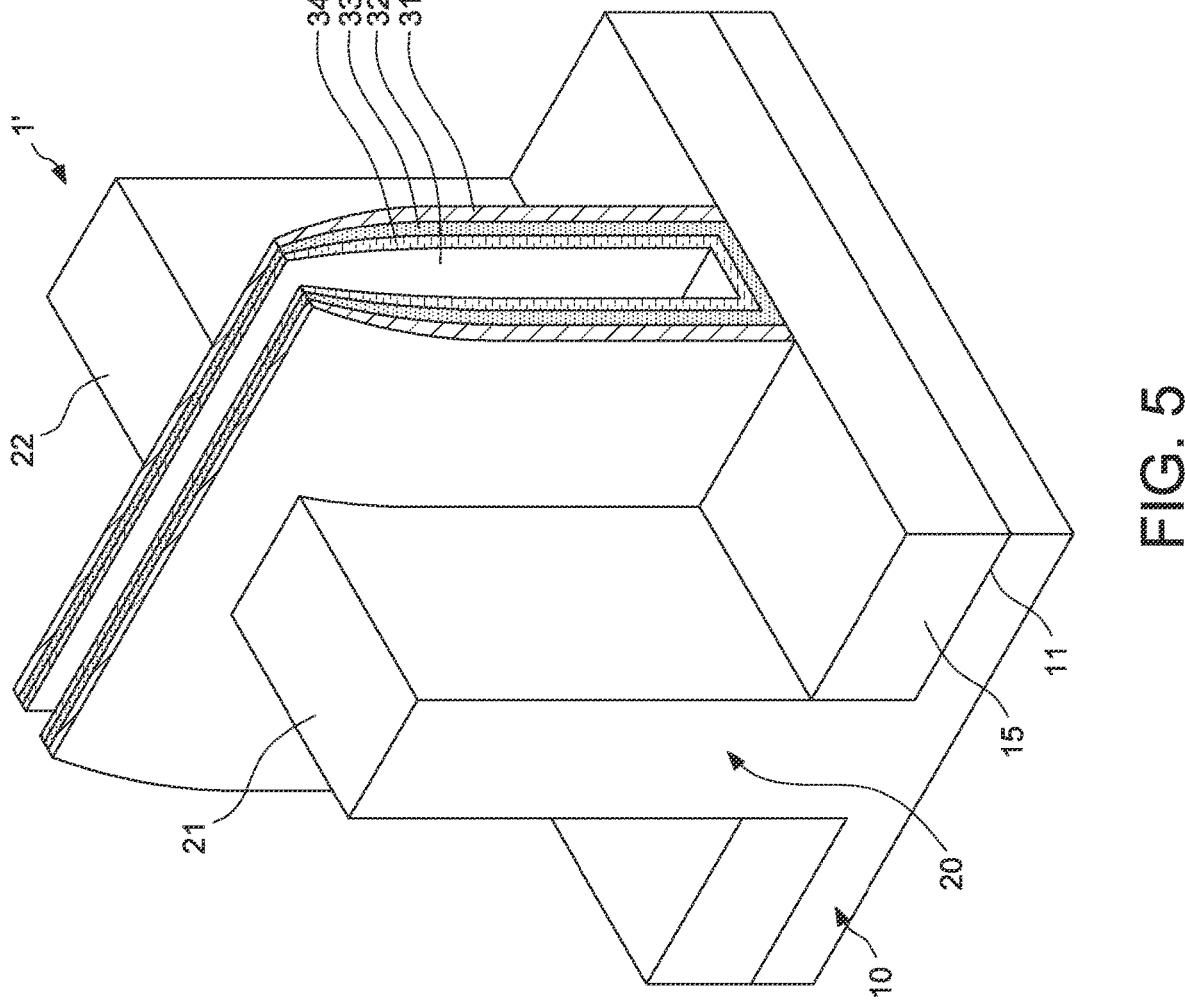
FIG. 5 illustrates a perspective view of one or more stages of an example of a method for manufacturing an electronic device according to some embodiments of the present disclosure.
Figure 6:
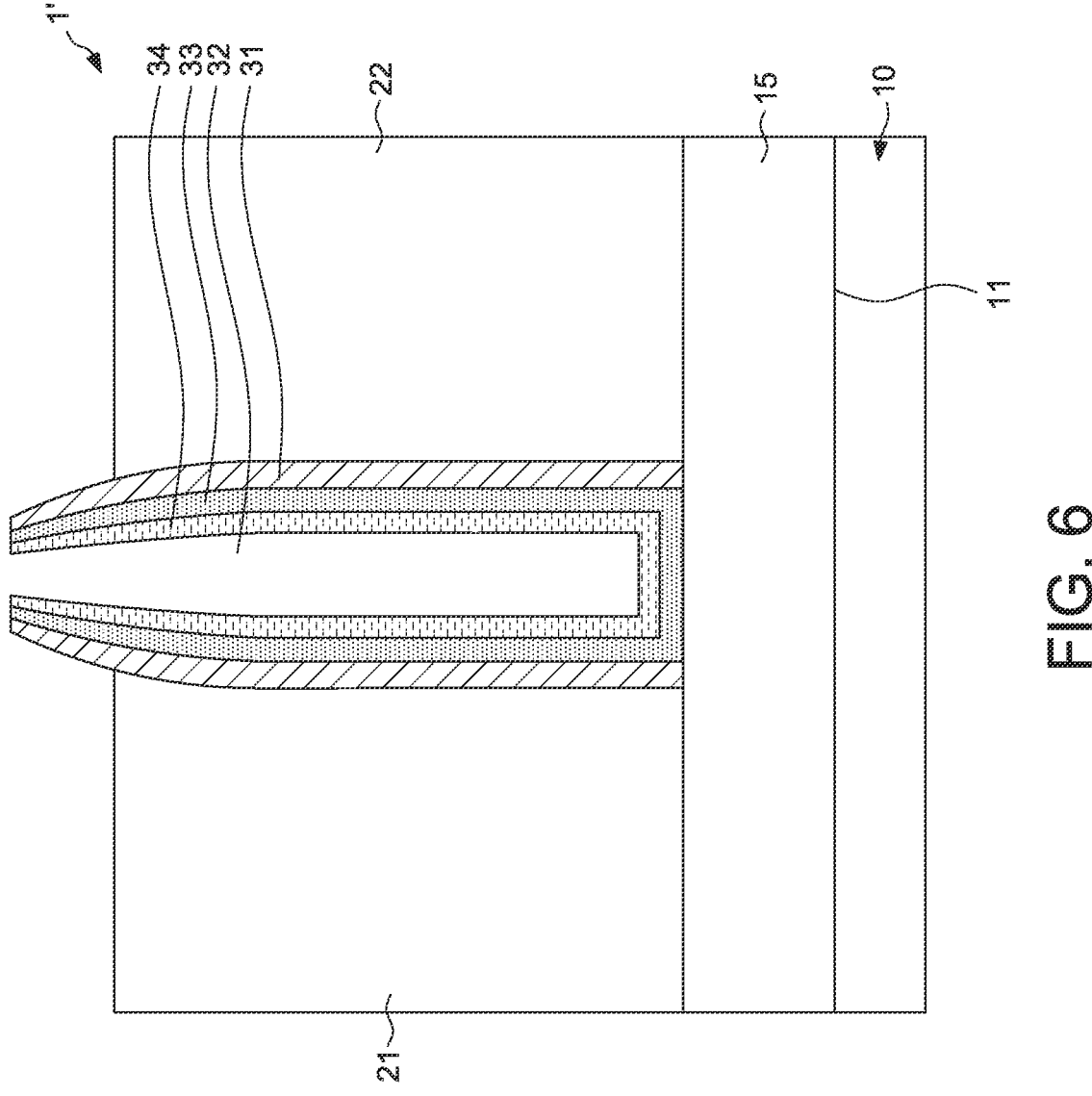
FIG. 6 illustrates a side view of one or more stages of an example of a method for manufacturing an electronic device according to some embodiments of the present disclosure.

Referring to FIG. 5 and FIG. 6, a semiconductor structure 1' is provided. FIG. 5 illustrates a perspective view of the semiconductor structure 1'. FIG. 6 illustrates a side view of the semiconductor structure 1' of FIG. 5. The semiconductor structure 1' can include a substrate 10, a spacer 31, a trench 32 and at least one gate dielectric layer (including, for example, a first gate dielectric layer 33 and a second gate dielectric layer 34).

The substrate 10 of FIG. 5 and FIG. 6 can be the same as the substrate 10 of FIG. 1 and FIG. 2. Thus, the substrate 10 of FIG. 5 and FIG. 6 can include a fin 20 and a shallow trench isolation (STI) 15. In some embodiments, the fin 20 can be, for example, silicon germanium fin. In some embodiments, the fin 20 can include a source region 21 and a drain region 22 opposite to the source region 21. The drain region 22 can be spaced apart from the source region 21. The shallow trench isolation 15 can be formed at two sides of the fin 20. In some embodiments, the source region 21 and the drain region 22 can be separated by the shallow trench isolation 15. In some embodiments, a material of the shallow trench isolation 15 can be, for example, silicon dioxide ($SiO_2$).

The spacer 31 can be formed between the source region 21 and the drain region 22 of the fin 20. In some embodiments, the spacer 31 can be, for example, nitride spacer. The trench 32 can extend through the spacer 31. In some embodiments, the trench 32 can also be referred to as "fin to fin spacing." The at least one gate dielectric layer (e.g., the first gate dielectric layer 33 and the second gate dielectric layer 34) can be formed in the trench 32 and contact the spacer 31. In some embodiments, the at least one gate dielectric layer (e.g., the first gate dielectric layer 33) can fully cover an inner wall of the trench 32. A material of the at least one gate dielectric layer (e.g., the first gate dielectric layer 33 and the second gate dielectric layer 34) can be, for example, a high-dielectric constant (high-K) material.

Figure 7:
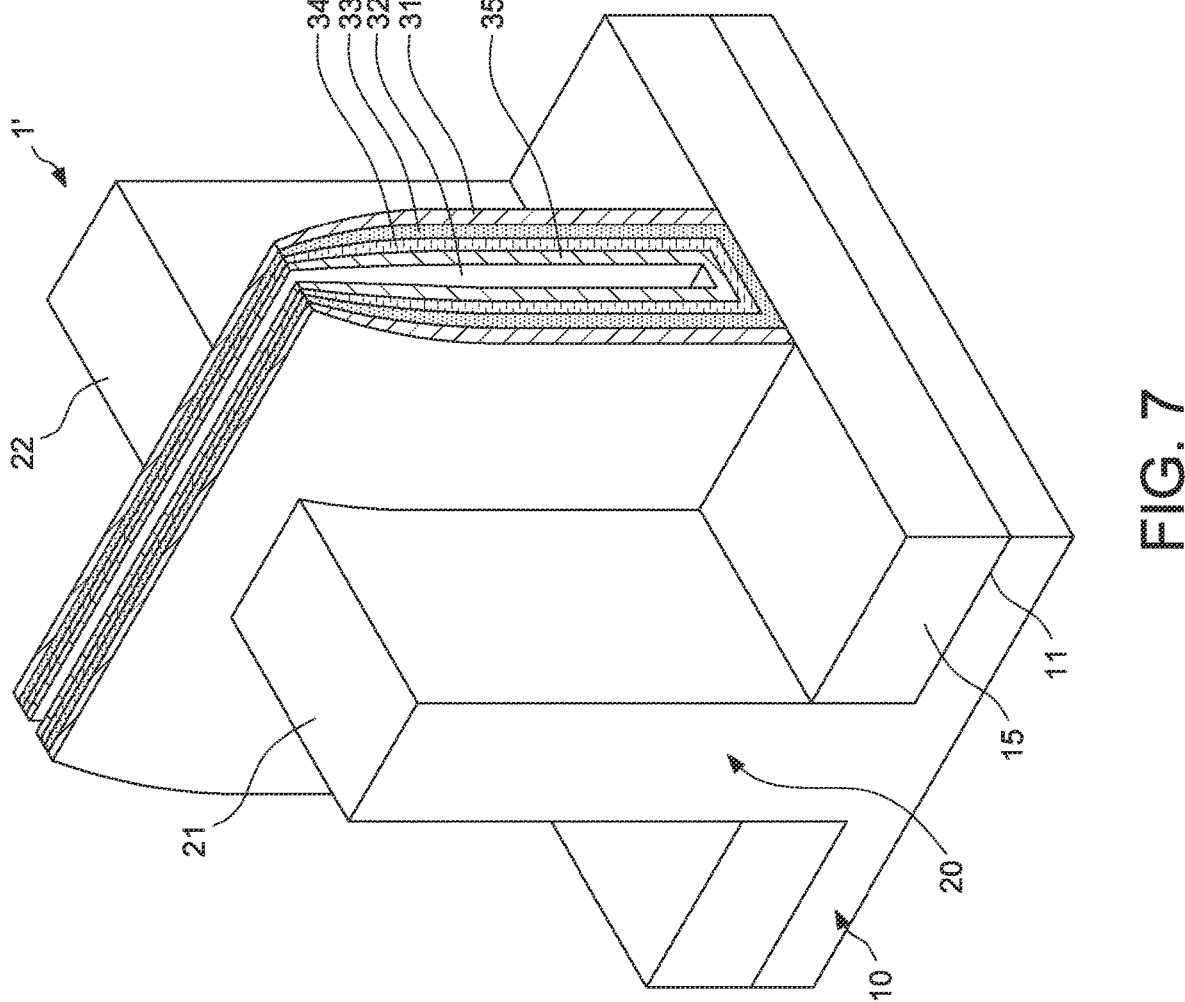
FIG. 7 illustrates a perspective view of one or more stages of an example of a method for manufacturing an electronic device according to some embodiments of the present disclosure.
Figure 8:
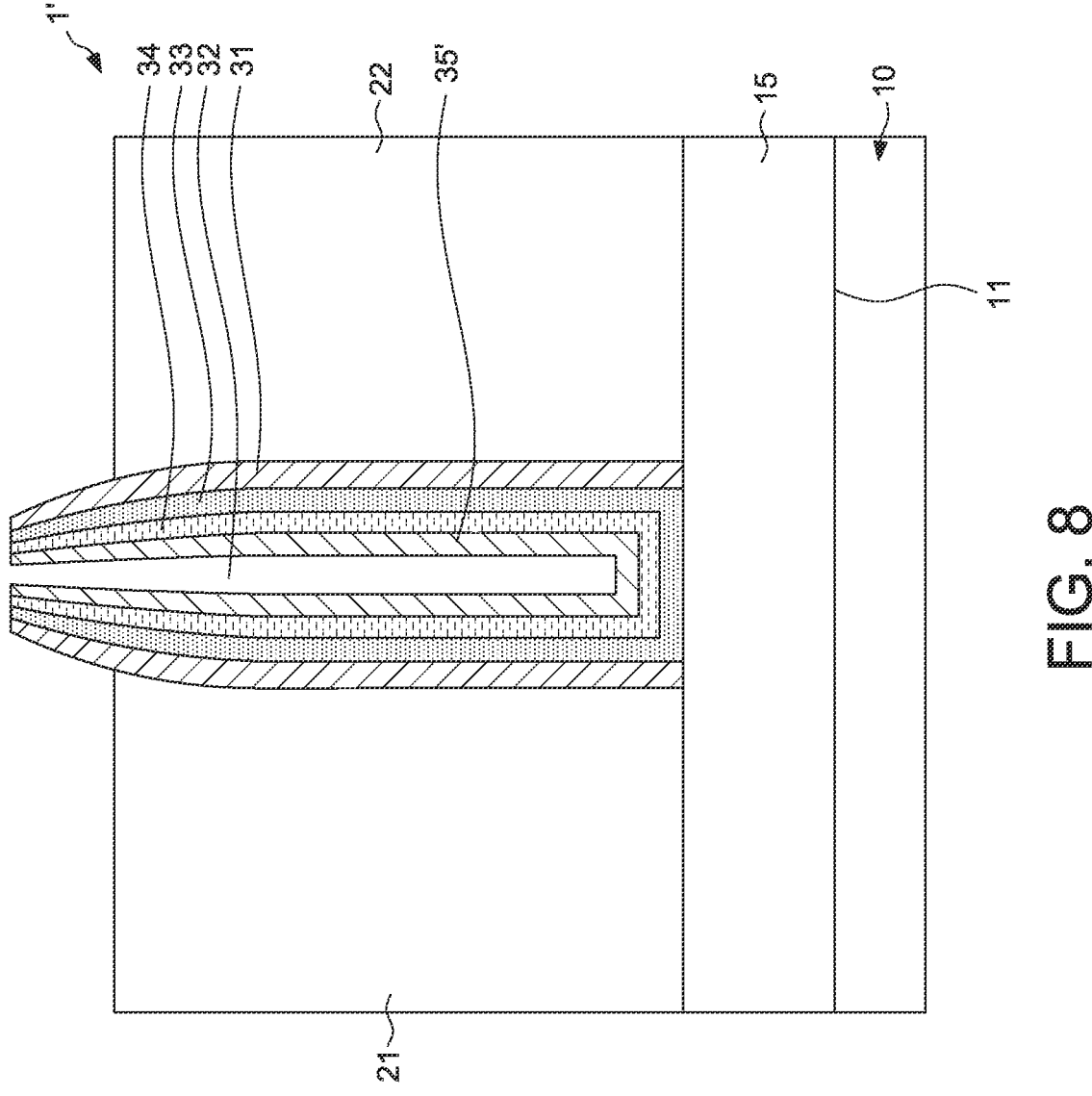
FIG. 8 illustrates a side view of one or more stages of an example of a method for manufacturing an electronic device according to some embodiments of the present disclosure.

Referring to FIG. 7 and FIG. 8, a metal material layer 35' is formed in the trench 32 and on the at least one gate dielectric layer (e.g., the second gate dielectric layer 34) by, for example, atomic layer deposition (ALD). FIG. 7 illustrates a perspective view of the semiconductor structure 1'. FIG. 8 illustrates a side view of the semiconductor structure 1' of FIG. 7. In some embodiments, the metal material layer 35' can include a platinum (Pt) layer, tantalum (Ta) layer or titanium (Ti) layer. In some embodiments, a thickness of the metal material layer 35' can be 4 Å to 30 Å, 6 Å to 30 Å, 8 Å to 30 Å, or 10 Å to 30 Å.

Figure 9:
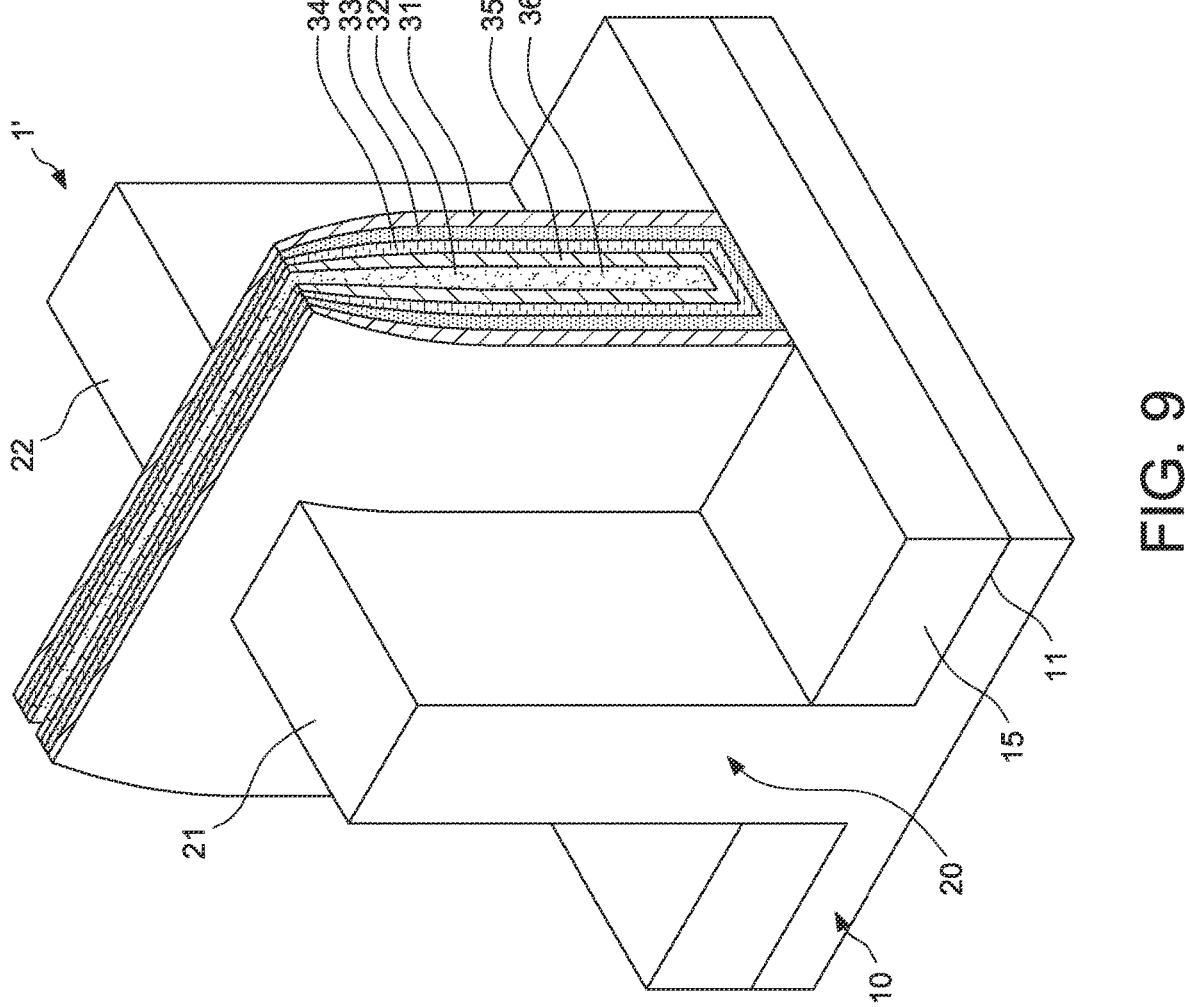
FIG. 9 illustrates a perspective view of one or more stages of an example of a method for manufacturing an electronic device according to some embodiments of the present disclosure.
Figure 10:
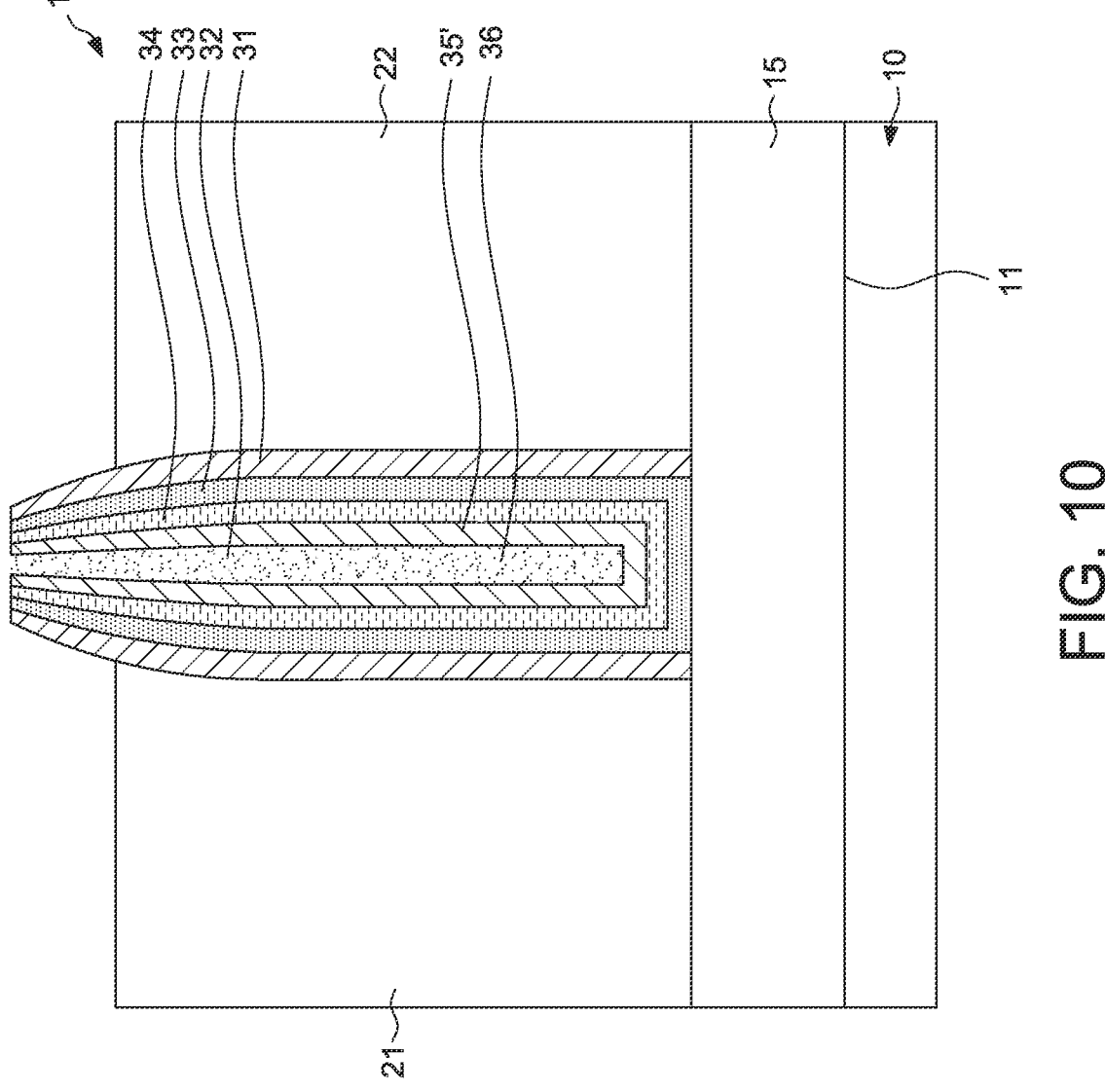
FIG. 10 illustrates a side view of one or more stages of an example of a method for manufacturing an electronic device according to some embodiments of the present disclosure.

Referring to FIG. 9, FIG. 10 and FIG. 1, the metal material layer 35' is vulcanized to form a work function layer 35 (FIG. 1) by a vulcanizing agent 36. FIG. 9 illustrates a perspective view of the semiconductor structure 1'. FIG. 10 illustrates a side view of the semiconductor structure 1' of FIG. 9. Meanwhile, the electronic device 1 is formed. In some embodiments, the vulcanizing agent 36 can include a Group VIA material. Thus, the work function layer 35 can include a compound of the metal material and the Group VIA material. In some embodiments, the Group VIA material can include sulfur (S) or selenium (Se). Therefore, the compound can include $Pt_xS_y$, $Pt_xSe_y$, $Ta_xS_y$, $Ta_xSe_y$, $Ti_xS_y$, or $Ti_xSe_y$. In some embodiments, x can be a multiple of 1, and y can be equal to 2x. That is, the compound can be, for example, $PtS_2$, $Pt_2S_4$, $PtSe_2$, $Pt_2Se_4$, $TaS_2$, $Ta_2S_4$, $TaSe_2$, $Ta_2Se_4$, $TiS_2$, $Ti_2S_4$, $TiSe_2$, $Ti_2Se_4$, and so on. As shown in FIG. 1, the work function layer 35 can be a multilayer structure (including, for example, a first compound layer 351, a second compound layer 352, a third compound layer 353 and a fourth compound layer 354). In some embodiments, a number of layers (e.g., the first compound layer 351, the second compound layer 352, the third compound layer 353 and the fourth compound layer 354) of the multilayer structure can be even. In some embodiments, each of the layers (e.g., the first compound layer 351, the second compound layer 352, the third compound layer 353 and the fourth compound layer 354) of the multilayer structure can have a same thickness (e.g., a maximum thickness). A thickness of each of the layers (e.g., the first compound layer 351, the second compound layer 352, the third compound layer 353 and the fourth compound layer 354) of the multilayer structure can be 2 Å to 5 Å. In some embodiments, a thickness of the work function layer 35 (including, for example, the first compound layer 351, the second compound layer 352, the third compound layer 353 and the fourth compound layer 354) can be 4 Å to 60 Å. The minimum number of the layers of the multilayer structure can be two. In some embodiments, the thickness of the work function layer 35 (including, for example, the first compound layer 351, the second compound layer 352, the third compound layer 353 and the fourth compound layer 354) can be, 6 Å to 50 Å, 8 Å to 40 Å, or 10 Å to 30 Å. In some embodiments, the second gate dielectric layer 34 can be omitted to increase the thickness of the work function layer 35. That is, the thickness of the work function layer 35 can be adjusted by changing the layer number of the gate dielectric layer.

The method of the present disclosure can be applied in FET processes; however, the disclosure is not limited thereto. As shown in the embodiments illustrated in FIG. 5 through FIG. 10, the metal material and the Group VIA material can collectively form ultra-thin (e.g., 2Å to 5Å) compound layers (including, for example, the first compound layer 351, the second compound layer 352, the third compound layer 353 and the fourth compound layer 354) by the vulcanizing process. Through the ultra-thin compound layers (e.g., the first compound layer 351, the second compound layer 352, the third compound layer 353 and the fourth compound layer 354), the work function layer 35 can fully fill the trench 32 (i.e., the fin to fin spacing) before an opening of the trench 32 is closed. Thus, no voids will be generated in the work function layer 35 to prevent threshold voltage variation or circuit failure of the electronic device 1.

Figure 11:
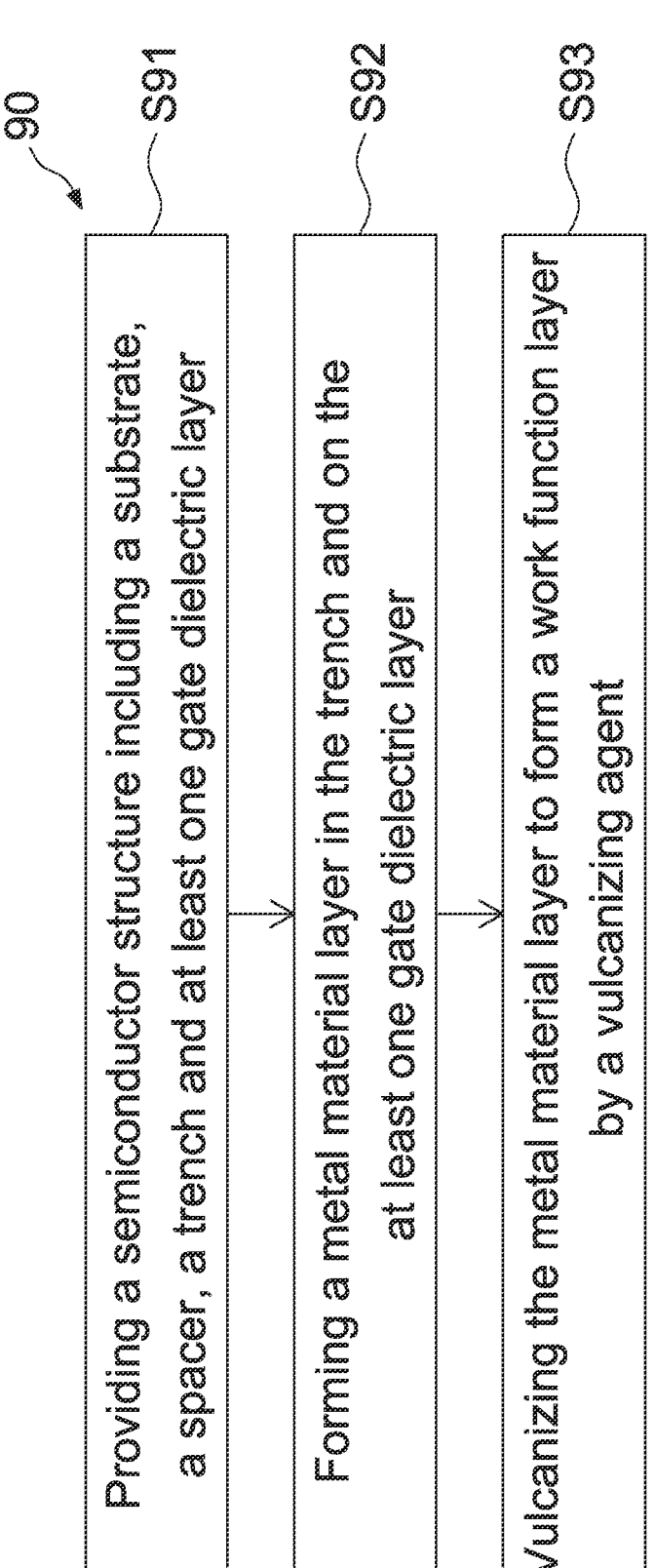
FIG. 11 illustrates a method for manufacturing an electronic device according to some embodiments of the present disclosure.

FIG. 11 illustrates a method 90 for manufacturing an electronic device according to some embodiments of the present disclosure.

In some embodiments, the method 90 can include a step S91, providing a semiconductor structure including a substrate, a spacer, a trench and at least one gate dielectric layer. For example, as shown in FIG. 5 and FIG. 6, the semiconductor structure 1' is provided. The semiconductor structure 1' includes the substrate 10, the spacer 31, the trench 32 and the at least one gate dielectric layer (including, for example, the first gate dielectric layer 33 and the second gate dielectric layer 34). The substrate 10 includes the fin 20. The fin 20 includes the source region 21 and the drain region 22 spaced apart from the source region 21. The spacer 31 is formed between the source region 21 and the drain region 22. The trench 32 extends through the spacer 31. The at least one gate dielectric layer (e.g., the first gate dielectric layer 33 and the second gate dielectric layer 34) is formed in the trench 32.

In some embodiments, the method 90 can include a step S92, forming a metal material layer in the trench and on the at least one gate dielectric layer. For example, as shown in FIG. 7 and FIG. 8, the metal material layer 35' is formed in the trench 32 and on the at least one gate dielectric layer (e.g., the second gate dielectric layer 34).

In some embodiments, the method 90 can include a step S93, vulcanizing the metal material layer to form a work function layer by a vulcanizing agent. For example, as shown in FIG. 9, FIG. 10 and FIG. 1, the metal material layer 35' is vulcanized to form the work function layer 35 by the vulcanizing agent 36.

In accordance with some embodiments of the present disclosure, an electronic device includes a substrate and a gate structure. The substrate includes a fin. The fin includes a source region and a drain region spaced apart from the source region. The gate structure is located between the source region and the drain region. The gate structure includes a work function layer. The work function layer includes a compound of a metal material and a Group VIA material. In addition, the metal material includes platinum (Pt), tantalum (Ta) or titanium (Ti). The Group VIA material includes sulfur (S) or selenium (Se). The compound includes $Pt_xS_y$, $Pt_xSe_y$, $Ta_xS_y$, $Ta_xSe_y$, $Ti_xS_y$, or $Ti_xSe_y$, x is a multiple of 1, and y is equal to 2x. The work function layer is a multilayer structure. A number of layers of the multilayer structure is even. A thickness of each of the layers of the multilayer structure is 2 Å to 5 Å. The gate structure further includes a spacer, a trench extending through the spacer and at least one gate dielectric layer located in the trench and contacting the spacer. The work function layer is located in the trench and spaced apart from the spacer through the at least one gate dielectric layer.

In accordance with some embodiments of the present disclosure, an electronic device includes a substrate, a plurality of semiconductor nano-sheet channels, a gate dielectric layer and a first gate layer. The plurality of semiconductor nano-sheet channels are located over the substrate and longitudinally spaced apart from each other. The gate dielectric layer surrounds the plurality of semiconductor nano-sheet channels. The first gate layer surrounds the gate dielectric layer. The first gate layer includes a compound of a first metal material and a Group VIA material. In addition, the first metal material includes platinum (Pt), tantalum (Ta) or titanium (Ti). The Group VIA material includes sulfur (S) or selenium (Se). The compound of the first gate layer includes $Pt_xS_y$, $Pt_xSe_y$, $Ta_xS_y$, $Ta_xSe_y$, $Ti_xS_y$, or $Ti_xSe_y$, x is a multiple of 1, and y is equal to 2x. A second gate layer further surrounds the first gate layer. The second gate layer includes a compound of a second metal material and the Group VIA material. The compound of the second gate layer is different from the compound of the first gate layer. The second metal material includes platinum (Pt), tantalum (Ta) or titanium (Ti). The compound of the second gate layer includes $Pt_xS_y$, $Pt_xSe_y$, $Ta_xS_y$, $Ta_xSe_y$, $Ti_xS_y$, or $Ti_xSe_y$, x is a multiple of 1, and y is equal to 2x. An interfacial layer is between the gate dielectric layer and each of the plurality of semiconductor nano-sheet channels.

In accordance with some embodiments of the present disclosure, a method for manufacturing an electronic device includes: providing a semiconductor structure including a substrate, a spacer, a trench and at least one gate dielectric layer, wherein the substrate includes a fin including a source region and a drain region spaced apart from the source region, the spacer is formed between the source region and the drain region, the trench extends through the spacer, and the at least one gate dielectric layer is formed in the trench;

forming a metal material layer in the trench and on the at least one gate dielectric layer; and vulcanizing the metal material layer to form a work function layer by a vulcanizing agent. In addition, the metal material layer includes a platinum (Pt) layer, tantalum (Ta) layer or titanium (Ti) layer. The vulcanizing agent includes a Group VIA material. The work function layer includes a compound of the metal material and the Group VIA material.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   a substrate including a fin, wherein the fin includes a source region and a drain region spaced apart from the source region; and
   a gate structure located between the source region and the drain region, and including a work function layer, wherein the work function layer includes a compound of a metal material and a Group VIA material, and is a multilayer structure.

2. The electronic device of claim 1, wherein the metal material includes platinum (Pt), tantalum (Ta) or titanium (Ti), and the Group VIA material includes sulfur(S) or selenium (Se).

3. The electronic device of claim 2, wherein the compound includes $Pt_xS_y$, $Pt_xSe_y$, $Ta_xS_y$, $Ta_xSe_y$, $Ti_xS_y$, or $Ti_xSe_y$, x is a multiple of 1, and y is equal to 2x.

4. The electronic device of claim 1, wherein a number of layers of the multilayer structure is even.

5. The electronic device of claim 4, wherein a thickness of each of the layers of the multilayer structure is 2 Å to 5 Å.

6. The electronic device of claim 4, wherein each of the layers of the multilayer structure has a same thickness.

7. The electronic device of claim 1, wherein the gate structure further includes a spacer, a trench extending through the spacer and at least one gate dielectric layer located in the trench and contacting the spacer, and the work function layer is located in the trench and spaced apart from the spacer through the at least one gate dielectric layer.

8. An electronic device, comprising:
   a substrate;
   a plurality of semiconductor nano-sheet channels located over the substrate and longitudinally spaced apart from each other;
   a gate dielectric layer surrounding the plurality of semiconductor nano-sheet channels;
   a first gate layer surrounding the gate dielectric layer, wherein the first gate layer includes a compound of a first metal material and a Group VIA material; and
   a second gate layer surrounding the first gate layer, wherein the second gate layer includes a compound of a second metal material and the Group VIA material.

9. The electronic device of claim 8, wherein the first metal material includes platinum (Pt), tantalum (Ta) or titanium (Ti), and the Group VIA material includes sulfur(S) or selenium (Se).

10. The electronic device of claim 9, wherein the compound of the first gate layer includes $Pt_xS_y$, $Pt_xSe_y$, $Ta_xS_y$, $Ta_xSe_y$, $Ti_xS_y$, or $Ti_xSe_y$, x is a multiple of 1, and y is equal to 2x.

11. The electronic device of claim 8, wherein the compound of the second gate layer is different from the compound of the first gate layer.

12. The electronic device of claim 8, wherein the second metal material includes platinum (Pt), tantalum (Ta) or titanium (Ti), and the Group VIA material includes sulfur(S) or selenium (Se).

13. The electronic device of claim 12, wherein the compound of the second gate layer includes $Pt_xS_y$, $Pt_xSe_y$, $Ta_xS_y$, $Ta_xSe_y$, $Ti_xS_y$, or $Ti_xSe_y$, x is a multiple of 1, and y is equal to 2x.

14. The electronic device of claim 8, further comprising an interfacial layer between the gate dielectric layer and each of the plurality of semiconductor nano-sheet channels.

15. An electronic device, comprising:

a substrate;

a plurality of semiconductor nanostructures located over the substrate and longitudinally spaced apart from each other;

a gate dielectric layer surrounding the plurality of semiconductor nanostructures;

a first gate layer surrounding the gate dielectric layer, wherein the first gate layer includes a first compound of a first metal material and a Group VIA material; and a second gate layer surrounding the first gate layer, wherein the second gate layer includes a second compound of a second metal material and the Group VIA material, wherein the first compound is different from the second compound.

16. The electronic device of claim 15, wherein at least one of the first gate layer and the second gate layer is a multilayer structure.

17. The electronic device of claim 16, wherein a number of layers of the multilayer structure is even.

18. The electronic device of claim 17, wherein each of the layers of the multilayer structure has a same thickness.

19. The electronic device of claim 15, wherein the gate dielectric layer includes a high-dielectric constant (high-K) material.

20. The electronic device of claim 15, wherein the first metal material includes platinum (Pt), tantalum (Ta) or titanium (Ti), and the Group VIA material includes sulfur(S) or selenium (Se).

\* \* \* \* \*